(12) United States Patent
Wang et al.

(10) Patent No.: US 10,515,603 B2
(45) Date of Patent: Dec. 24, 2019

(54) SHIFT REGISTER, DRIVING METHOD, GATE DRIVING CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Zhangmeng Wang, Beijing (CN); Xianjie Shao, Beijing (CN); Li Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/133,755

(22) Filed: Sep. 18, 2018

(65) Prior Publication Data

US 2019/0295489 A1  Sep. 26, 2019

(30) Foreign Application Priority Data

Mar. 20, 2018 (CN) .......................... 2018 1 0229123

(51) Int. Cl.
*G09G 3/36* (2006.01)
*G11C 19/28* (2006.01)
*G11C 8/04* (2006.01)

(52) U.S. Cl.
CPC ......... *G09G 3/3685* (2013.01); *G09G 3/3648* (2013.01); *G09G 3/3677* (2013.01); *G11C 8/04* (2013.01); *G11C 19/28* (2013.01); *G09G 2310/0286* (2013.01); *G09G 2310/08* (2013.01)

(58) Field of Classification Search
CPC ...... G09G 3/3266; G09G 3/36; G09G 3/3648; G09G 3/367; G09G 3/3677; G09G 3/3685; G09G 3/3696; G09G 2310/0286; G11C 8/04; G11C 19/28
See application file for complete search history.

(56) References Cited

U.S. PATENT DOCUMENTS

| | | | | |
|---|---|---|---|---|
| 9,489,878 B2* | 11/2016 | Pai | ............................ | G09G 3/20 |
| 9,881,543 B2* | 1/2018 | Ma | ........................ | G11C 19/28 |
| 10,121,437 B2* | 11/2018 | Gu | ....................... | G09G 3/3677 |
| 10,210,791 B2* | 2/2019 | Li | ............................ | G09G 3/20 |

(Continued)

*Primary Examiner* — Joe H Cheng
(74) *Attorney, Agent, or Firm* — Nath, Goldberg & Meyer; Joshua B. Goldberg (57) ABSTRACT

A shift register, a driving method, a gate driving circuit, and a display device are provided. The shift register includes an input circuit and an output control circuit. The input circuit transmits a first signal from a first power terminal or a second signal from a second power terminal to the output control circuit under control of an input signal, a first clock signal and a second clock signal. The output control circuit transmits the first signal from the first power terminal or the second signal from the second power terminal to a signal output terminal under control of the first clock signal and the second clock signal. The input signal input to the shift register is delayed and output to a signal input terminal of a shift register in a next row.

15 Claims, 4 Drawing Sheets

(56) References Cited

U.S. PATENT DOCUMENTS

| | | | | |
|---|---|---|---|---|
| 2007/0274432 A1* | 11/2007 | Yu | ............... | G11C 19/28 377/64 |
| 2016/0163401 A1* | 6/2016 | Nonaka | ............ | G11C 19/28 345/214 |
| 2016/0172054 A1* | 6/2016 | Shao | ............ | G11C 19/184 345/100 |
| 2016/0329015 A1* | 11/2016 | Ji | ............ | G09G 3/32 |
| 2019/0043400 A1* | 2/2019 | Huang | ............ | G09G 3/20 |
| 2019/0057638 A1* | 2/2019 | Kim | ............ | G09G 3/20 |

* cited by examiner

SHIFT REGISTER, DRIVING METHOD, GATE DRIVING CIRCUIT, AND DISPLAY DEVICE

CROSS-REFERENCE TO RELATED APPLICATIONS

The present disclosure claims the priority of Chinese Patent Application No. 201810229123.0, filed on Mar. 20, 2018, the contents of which are incorporated herein by reference in its entirety.

TECHNICAL FIELD

The present disclosure relates to the field of display technologies, and in particular, to a shift register, a driving method, a gate driving circuit, and a display device.

BACKGROUND

With the rapid development of liquid crystal display technology, liquid crystal panels are applied to small-sized products such as smart watches and smart bracelets. MIP panels are commonly used for the smaller-sized products and have a small size and a smaller-scaled driving circuit. In the MIP panels, the driving circuit can be arranged in a limited space, and the normal operation of the display panel is ensured.

SUMMARY

According to an aspect of the disclosure, a shift register is provided. The shift register includes an input circuit and an output control circuit. The input circuit is coupled to a signal input terminal, a first clock signal terminal, a second clock signal terminal, a first power terminal and a second power terminal, respectively; and the input circuit is configured to transmit a first signal from the first power terminal or a second signal from the second power terminal to an output control circuit under control of an input signal, a first clock signal and a second clock signal. The output control circuit is coupled to the input circuit, the first clock signal terminal, the second clock signal terminal, the first power terminal, the second power terminal, and a signal output terminal, respectively; the output control circuit is configured to transmit the first signal from the first power terminal or the second signal from the second power terminal to the signal output terminal under control of the first clock signal and the second clock signal. The input signal input to the shift register is delayed and output to a signal input terminal of a shift register in a next row.

In an embodiment, the input circuit includes a first transistor, a second transistor, a third transistor, a fourth transistor, a fifth transistor, and a sixth transistor.

The first transistor has a first electrode, a second electrode and a gate, the first electrode of the first transistor is coupled to the first power terminal, the second electrode of the first transistor is coupled to a first electrode of the second transistor, and the gate electrode of the first transistor is coupled to the first clock signal terminal.

The second transistor has a second electrode and a gate, the second electrode of the second transistor is coupled to a first electrode of the fifth transistor and a first electrode of the sixth transistor, and the gate of the second transistor is coupled to the signal input terminal.

The third transistor has a first electrode, a second electrode and a gate, the first electrode of the third transistor is coupled to the second power terminal, the second electrode of the third transistor is coupled to the first electrode of the fifth transistor and the first electrode of the sixth transistor, and the gate of the third transistor is coupled to the signal input terminal.

The fourth transistor has a first electrode, a second electrode and a gate, the first electrode of the fourth transistor is coupled to the second power terminal, the second electrode of the fourth transistor is coupled to the first electrode of the fifth transistor and the first electrode of the sixth transistor, and the gate of the fourth transistor is coupled to the first clock signal terminal.

The fifth transistor has a second electrode and a gate, the second electrode of the fifth transistor is coupled to an output terminal of the input circuit, and the gate of the fifth transistor is coupled to the first clock signal terminal.

The sixth transistor has a second electrode and a gate, the second electrode of the sixth transistor is coupled to the output terminal of the input circuit, and the gate of the sixth transistor is coupled to the second clock signal terminal.

In an embodiment, the output control circuit includes a seventh transistor, an eighth transistor, a ninth transistor, a tenth transistor, an eleventh transistor, a twelfth transistor, a thirteenth transistor, and a fourteenth transistor.

The ninth transistor has a first electrode, a second electrode and a gate, the first electrode of the ninth transistor is coupled to the first power terminal, the second electrode of the ninth transistor is coupled to the signal output terminal of the output control circuit, and the gate of the ninth transistor is coupled to the output terminal of the input circuit.

The tenth transistor has a first electrode, a second electrode and a gate, the first electrode of the tenth transistor is coupled to the second power terminal, the second electrode of the tenth transistor is coupled to the signal output terminal of the output control circuit, and the gate of the tenth transistor is coupled to the output terminal of the input circuit.

The eleventh transistor has a first electrode, a second electrode and a gate, the first electrode of the eleventh transistor is coupled to the first power terminal, the second electrode of the eleventh transistor is coupled to a first electrode of the twelfth transistor, and the gate of the eleventh transistor is coupled to the second clock signal terminal;

the twelfth transistor has a second electrode and a gate, the second electrode of the twelfth transistor is coupled to a first electrode of the seventh transistor and a first electrode of the eighth transistor, and the gate of the twelfth transistor is coupled to the signal output terminal of the output control circuit.

The thirteenth transistor has a first electrode, a second electrode and a gate, the first electrode of the thirteenth transistor is coupled to the second power terminal, the second electrode of the thirteenth transistor is coupled to the first electrode of the seventh transistor and the first electrode of the eighth transistor, and the gate of the thirteenth transistor is coupled to the signal output terminal of the output control circuit.

The fourteenth transistor has a first electrode, a second electrode and a gate, the first electrode of the fourteenth transistor is coupled to the second power terminal, the second electrode of the fourteenth transistor is coupled to the first electrode of the seventh transistor and the first electrode of the eighth transistor, and the gate of the fourteenth transistor is coupled to the second clock signal terminal.

The seventh transistor has a second electrode and a gate, the second electrode of the seventh transistor is coupled to the gate of the ninth transistor and the gate of the tenth transistor, and the gate of the seventh transistor is coupled to the second clock signal terminal.

The eighth transistor has a second electrode and a gate, the second electrode of the eighth transistor is coupled to the gate of the ninth transistor and the gate of the tenth transistor, and the gate of the eighth transistor is coupled to the first clock signal terminal.

In an embodiment, the first transistor, the second transistor, the fifth transistor, the seventh transistor, the ninth transistor, the eleventh transistor, and the twelfth transistor are P-type transistors.

The third transistor, the fourth transistor, the sixth transistor, the eighth transistor, the tenth transistor, the thirteenth transistor, and the fourteenth transistor are N-type transistors.

In an embodiment, the first clock signal and the second clock signal are inverted with respect to each other.

In an embodiment, the first power terminal is configured to output a first level, and the second power terminal is configured to output a second level, and the first level is higher than the second level.

According to an aspect of the disclosure, a driving method for driving a shift register is provided, the driving method includes the following:

controlling the shift register to output a third signal as an output signal under control of the first clock signal and the second clock signal, at a first stage when the input signal of the input circuit is a first signal;

controlling the shift register to output the first signal as the output signal under control of the first clock signal and the second clock signal, at a second stage when the input signal of the input circuit is a second signal; and controlling the shift register to output the second signal as the output signal under control of the first clock signal and the second clock signal, at a third stage when the input signal of the input circuit is the third signal.

According to an aspect of the disclosure, a gate driving circuit includes a plurality of cascaded gate driving units, each of the gate driving units includes the shift register described above.

In an embodiment, each of the gate driving units further includes a shaping unit coupled to the signal output terminal of the shift register, an enable signal terminal, the first power terminal, and the second power terminal. The shaping unit is configured to adjust a pulse width of a data signal output from the shift register under control of an enable signal.

In an embodiment, the shaping unit includes a fifteenth transistor, a sixteenth transistor, a seventeenth transistor, an eighteenth transistor, a nineteenth transistor, and a twentieth transistor.

The fifteenth transistor has a first electrode, a second electrode and a gate, the first electrode of the fifteenth transistor is coupled to the first power terminal, the second electrode of the fifteenth transistor is coupled to a gate of the nineteenth transistor and a gate of the twentieth transistor, and the gate of the fifteenth transistor is coupled to the enable signal terminal.

The sixteenth transistor has a first electrode, a second electrode and a gate, the first electrode of the sixteenth transistor is coupled to the first power terminal, the second electrode of the sixteenth transistor is coupled to the gate of the nineteenth transistor and the gate of the twentieth transistor, and the gate of the sixteenth transistor is coupled to the signal output terminal of the shift register.

The seventeenth transistor has a first electrode, a second electrode and a gate, the first electrode of the seventeenth transistor is coupled to a second electrode of the eighteenth transistor, the second electrode of the seventeenth transistor is coupled to the gate of the nineteenth transistor and the gate of the twentieth transistor, and the gate of the seventeenth transistor is coupled to the signal output terminal of the shift register.

The eighteenth transistor has a first electrode, a second electrode and a gate, the first electrode of the eighteenth transistor is coupled to the second power terminal, the second electrode of the eighteenth transistor is coupled to the first electrode of the seventeenth transistor, and the gate of the eighteenth transistor is coupled to the enable signal terminal.

The nineteenth transistor has a first electrode and a second electrode, the first electrode of the nineteenth transistor is coupled to the first power terminal, and the second electrode of the nineteenth transistor is coupled to an output terminal of the shaping unit.

The twentieth transistor has a first electrode and a second electrode, the first electrode of the twentieth transistor is coupled to the second power terminal, and the second electrode of the twentieth transistor is coupled to the output terminal of the shaping unit.

In an embodiment, each of the gate driving units further includes a buffer unit coupled to the output terminal of the shaping unit, and the buffer unit is configured to smooth a data signal from the shaping unit.

In an embodiment, the buffer unit includes a twenty-first transistor, a twenty-second transistor, a twenty-third transistor, and a twenty-fourth transistor.

The twenty-first transistor has a first electrode, a second electrode and a gate, the first electrode of the twenty-first transistor is coupled to the first power terminal, the second electrode of the twenty-first transistor is coupled to a gate of the twenty-third transistor and a gate of the twenty-fourth transistor, and the gate of the twenty-first transistor is coupled to the output terminal of the shaping unit.

The twenty-second transistor has a first electrode, a second electrode and a gate, the first electrode of the twenty-second transistor is coupled to the second power terminal, the second electrode of the twenty-second transistor is coupled to the gate of the twenty-third transistor and the gate of the twenty-fourth transistor, and the gate of the twenty-second transistor is coupled to the output terminal of the shaping unit.

The twenty-third transistor has a first electrode and a second electrode, the first electrode of the twenty-third transistor is coupled to the first power terminal, and the second electrode of the twenty-third transistor is coupled to an output terminal of the buffer unit.

The twenty-fourth transistor has a first electrode and a second electrode, the first electrode of the twenty-fourth transistor is coupled to the second power terminal, and the second electrode of the twenty-fourth transistor is coupled to the output terminal of the buffer unit.

In an embodiment, the fifteenth transistor, the sixteenth transistor, the nineteenth transistor, the twenty-first transistor, and the twenty-third transistor are P-type transistors.

The seventeenth transistor, the eighteenth transistor, the twentieth transistor, the twenty-second transistor, and the twenty-fourth transistor are N-type transistors.

In an embodiment, any two adjacent gate driving units include an upper-stage gate driving unit and a lower-stage gate driving unit.

An output terminal of a shift register in the upper-stage gate driving unit is coupled to a signal input terminal of a shift register in the lower-stage gate driving unit.

According to an aspect of the disclosure, a display device including the gate driving circuit described above is provided.

DETAILED DESCRIPTION

The embodiments of the present disclosure will be described in detail below with reference to the accompanying drawings. It is to be understood that the embodiments described herein are merely used for describing and explaining the present disclosure rather than limiting of the present disclosure.

Figure 1:
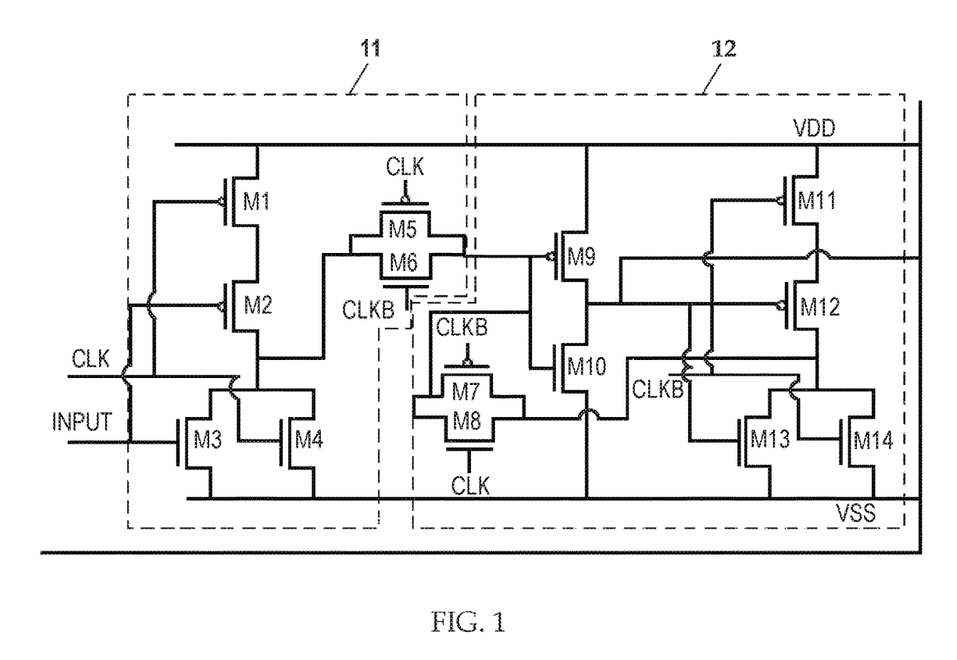
FIG. 1 is a schematic structural diagram of a shift register according to an embodiment of the present disclosure.

FIG. 1 is a schematic structural diagram of a shift register according to an embodiment of the present disclosure. As shown in FIG. 1, an embodiment of the present disclosure provides a shift register 1 including an input circuit 11 and an output control circuit 12.

The input circuit 11 is respectively coupled to a signal input terminal INPUT, a first clock signal terminal, a second clock signal terminal, a first power terminal VDD and a second power terminal VSS. The input circuit 11 is configured to transmit a first signal from the first power terminal VDD or a second signal from the second power terminal VSS to the output control circuit 12 under the control of a first clock signal CLK and a second clock signal CLKB. The first power terminal VDD outputs a high-level signal, and the second power terminal VSS outputs a low-level signal, and the signal output from the first power terminal VDD has a higher or greater level than that of the signal output from the second power terminal VSS.

The output control circuit 12 is respectively coupled to the input circuit 11, the first clock signal terminal, the second clock signal terminal, the first power terminal VDD, the second power terminal VSS, and a signal output terminal OUTPUT. The output control circuit 12 is configured to transmit the first signal from the first power terminal VDD or the second signal from the second power terminal VSS to the signal output terminal OUTPUT under the control of the first clock signal CLK and the second clock signal CLKB. An output signal from the shift register 1 is delayed and output to a signal input terminal of a shift register in a next row.

The input circuit 11 and the output control circuit 12 may each be composed of a plurality of transistors in accordance with control logic. The transistors may be P-type transistors or N-type transistors, and the structures of the transistors may be set according to its function and are not limited herein.

The input terminal of the input circuit 11 can be coupled to a signal input terminal INPUT, so that a data signal from the signal input terminal INPUT can enter the shift register 1 through the input circuit 11. The input circuit 11 can determine whether the data signal can be transmitted to the output control circuit 12 based on the specific control logic. Specifically, when the input circuit 11 is in a first state, the data signal from the signal input terminal INPUT may be transmitted to the output control circuit 12 through the input circuit 11, so as to control the output control circuit 12; when the input circuit 11 is in a second state, the transmission of the data signal from the signal input terminal INPUT is terminated and the data signal cannot be transmitted to the output control circuit 12. In other words, the input circuit 11 can output the data signal or interrupt the transmission of the data signal under the control of the first clock signal CLK and the second clock signal CLKB, so as to implement a control function of the control logic. The first clock signal CLK and the second clock signal CLKB may always be inverted with respect to each other. For example, when the first clock signal has a low level, the second clock signal has a high level; when the first clock signal has a high level, the second clock signal has a low level. The high level is higher than the low level. The high level is represented by 1, and the low level is represented by 0. It should be noted that other values may be applied herein, which is not limited herein.

An input terminal of the output control circuit 12 is coupled to the output terminal of the input circuit 11, and the signal output terminal of the output control circuit 12 may be coupled to a gate of a pixel driving transistor in a pixel driving circuit and an input terminal of the shift register 1 in the next row. The output control circuit 12 has functions of sending a control signal to the pixel driving circuit so as to control the pixel driving transistor in the pixel driving circuit, and delaying and outputting a data signal to a shift register 1 in the next row, so that shift registers 1 can perform scanning in chronological order and respectively control corresponding pixel driving circuits to operate. The output control circuit 12 may delay and output a data signal from the input circuit 11 under the control of the first clock signal CLK and the second clock signal CLKB. For example, input time of a data signal of the shift register 1 in the next row may be delayed by half a clock cycle with respect to input time of a data signal of the shift register 1 in the current row, so that it is only necessary to transmit the data signal to the shift register 1 in the first row, and the data signals of the shift registers 1 in other rows may be delayed and scanned sequentially, when the display device is displaying.

The shift register according to the present disclosure is provided in the driving circuit, and includes the input circuit and the output control circuit. The input circuit may transmit the data signal from the input terminal to the output control circuit, and then the output control circuit may delay and output the data signal to a signal input terminal of the shift register in the next row, so as to implement the control of a driving circuit in the next row and the scanning of the data signal. Furthermore, the shift register can further transmit the data signal to the gate of the pixel driving transistor, so as to control the driving circuit in the row in which the shift register is located. With the arrangement of the input circuit and the output control circuit, the structure of the driving circuit is simplified, the number of transistors is reduced, thus manufacturing cost of components is lower, and the power consumption of the driver circuit is reduced.

The structure of the input circuit 11 may be designed in various forms. In an embodiment, the input circuit 11 includes a first transistor M1, a second transistor M2, a third transistor M3, a fourth transistor M4, a fifth transistor M5, and a sixth transistor M6. The first transistor M1 has a first electrode, a second electrode and a gate, the first electrode of the first transistor M1 is coupled to the first power terminal VDD, the second electrode the first transistor M1 is coupled to a first electrode of the second transistor M2, and the gate the first transistor M1 is coupled to the first clock signal terminal. The second transistor M2 has a second electrode and a gate, the second electrode of the second transistor M2 is coupled to a first electrode of the fifth transistor M5 and a first electrode of the sixth transistor M6, and the gate of the second transistor M2 is coupled to the signal input terminal INPUT. The third transistor M3 has a first electrode, a second electrode and a gate, the first electrode of the third transistor M3 is coupled to the second power terminal VSS, the second electrode the third transistor M3 is coupled to the first electrode of the fifth transistor M5 and the first electrode of the sixth transistor M6, and the gate the third transistor M3 is coupled to the signal input terminal INPUT. The fourth transistor M4 has a first electrode, a second electrode and a gate, the first electrode of the fourth transistor M4 is coupled to the second power terminal VSS, the second electrode of the fourth transistor M4 is coupled to the first electrode of the fifth transistor M5 and the first electrode of the sixth transistor M6, and the gate of the fourth transistor M4 is coupled to the first clock signal terminal. The fifth transistor M5 has a second electrode and a gate, the second electrode of the fifth transistor M5 is coupled to an output terminal of the input circuit 11, and the gate of the fifth transistor M5 is coupled to the first clock signal terminal. The sixth transistor M6 has a second electrode and a gate, the second electrode of the sixth transistor M6 is coupled to the output terminal of the input circuit 11, and the gate of sixth transistor M6 is coupled to the second clock signal terminal.

Figure 2:
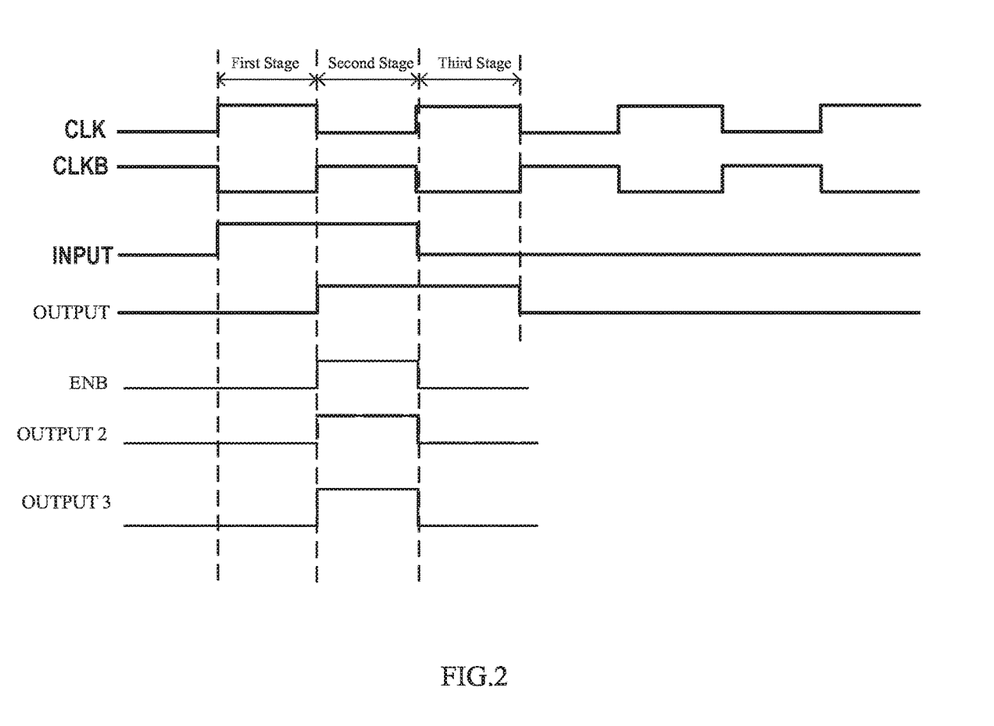
FIG. 2 is a timing diagram of a shift register according to an embodiment of the present disclosure.

FIG. 2 is a timing diagram of a shift register according to an embodiment of the present disclosure. The timing of the input circuit 11 is described with reference to FIG. 2.

In a first stage when the input signal terminal INPUT is supplied with a high-level signal, the first clock signal CLK has a high level, and the second clock signal CLKB has a low level, the first transistor M1 and the second transistor M2 are turned off, the third transistor M3 is turned on, the fourth transistor M4 is turned on, and the fifth transistor M5 and the sixth transistor M6 are turned off. Since the fifth transistor M5 and the sixth transistor M6 are turned off, the data signal from the input circuit 11 cannot be transmitted to the output control circuit 12.

In a second stage when the input signal terminal INPUT is supplied with a high-level signal, the first clock signal CLK has a low level, and the second clock signal CLKB has a high level, the first transistor M1 is turned on, the second transistor M2 and the fourth transistor M4 are turned off, and the third transistor M3, the fifth transistor M5 and the sixth transistor M6 are turned on, so that the output signal of the input circuit 11 has a low level.

In a third stage when the input signal terminal INPUT is supplied with a low-level signal, the first clock signal CLK has a high level, and the second clock signal CLKB has a low level, the fifth transistor M5 and the sixth transistor M6 are turned off. Therefore, the input circuit 11 has no output signal. According to the above control process, the input circuit 11 is in an off state in the first stage and the third stage, and outputs a low-level signal in the second stage. Therefore, the input circuit 11 is switched on and off once every half cycle, and has an output signal of low level. With the continuous on/off control of the input circuit 11 and the cooperation between the input circuit 11 and the output control circuit 12, the driving with delay of the data signal can be realized, thereby ensuring the display effect of the display device.

The structure of the output control circuit 12 may be designed in various forms. In an embodiment, the output control circuit 12 includes a seventh transistor M7, an eighth transistor M8, a ninth transistor M9, a tenth transistor M10, an eleventh transistor M11, a twelfth transistor M12, a thirteenth transistor M13, and a fourteenth transistor M14. The ninth transistor M9 has a first electrode, a second electrode and a gate, the first electrode of the ninth transistor M9 is coupled to the first power terminal VDD, the second electrode of the ninth transistor M9 is coupled to the signal output terminal of the output control circuit 12, and the gate of the ninth transistor M9 is coupled to the output terminal of the input circuit 11. The tenth transistor M10 has a first electrode, a second electrode and a gate, the first electrode of the tenth transistor M10 is coupled to the second power terminal VSS, the second electrode of the tenth transistor M10 is coupled to the signal output terminal of the output control circuit 12, and the gate of the tenth transistor M10 is coupled to the output terminal of the input circuit 11. The eleventh transistor M11 has a first electrode, a second electrode and a gate, the first electrode of the eleventh transistor M11 is coupled to the first power terminal VDD, the second electrode of the eleventh transistor M11 is coupled to a first electrode of the twelfth transistor M12, and the gate of the eleventh transistor M11 is coupled to the second clock signal terminal. The twelfth transistor M12 has a second electrode and a gate, the second electrode of the twelfth transistor M12 is coupled to a first electrode of the seventh transistor M7 and a first electrode of the eighth transistor M8, and the gate of the twelfth transistor M12 is coupled to the signal output terminal of the output control circuit 12. The thirteenth transistor M13 has a first electrode, a second electrode and a gate, the first electrode of the thirteenth transistor M13 is coupled to the second power terminal VSS, the second electrode of the thirteenth transistor M13 is coupled to the first electrode of the seventh transistor M7 and the first electrode of the eighth transistor M8, and the gate of the thirteenth transistor M13 is coupled to the signal output terminal of the output control circuit 12. The fourteenth transistor M14 has a first electrode, a second electrode and a gate, the first electrode of the fourteenth transistor M14 is coupled to the second power terminal VSS, the second electrode of the fourteenth transistor M14 is coupled to the first electrode of the seventh transistor M7 and the first electrode of the eighth transistor M8, and the gate of the fourteenth transistor M14 is coupled to the second clock signal terminal. The seventh transistor M7 has a second electrode and a gate, the second electrode of the seventh transistor M7 is coupled to the gate of the ninth transistor M9 and the gate of the tenth transistor M10, and the gate of the seventh transistor M7 is coupled to the second clock signal terminal. The eighth transistor M8 has a second electrode and a gate, the second electrode of the eighth transistor M8 is coupled to the gate of the ninth transistor M9 and the gate of the tenth transistor M10, and the gate of the eighth transistor M8 is coupled to the first clock signal terminal.

The timing of the output control circuit 12 is described with reference to FIG. 2.

In the first stage, since the input circuit 11 cannot transmit the data signal to the output control circuit 12, the signal output terminal (OUTPUT) of the output control circuit 12 outputs a low-level signal. In the first stage when the first clock signal CLK has a high level and the second clock signal CLKB has a low level, the eleventh transistor M11 and the twelfth transistor M12 are turned on, and the thirteenth transistor M13 and the fourteen transistor M14 is turned off. An NOR gate circuit composed of the eleventh transistor M11, the twelfth transistor M12, the thirteenth transistor M13, and the fourteenth transistor M14 outputs a high-level signal. In addition, since the seventh transistor M7 and the eighth transistor M8 are turned on, the high-level signal output by the NOR gate circuit may be input to the gates of the ninth transistor M9 and the tenth transistor M10, so that the ninth transistor M9 is turned off and the tenth transistor M10 is turned on, and thus the signal output terminal (OUTPUT) of the output control circuit 12 outputs a low-level signal.

In the second stage when the first clock signal CLK has a low level and the second clock signal CLKB has a high level, the input circuit 11 outputs a low-level signal, so that the ninth transistor M9 is turned on and the tenth transistor M10 is turned off. Thus, the signal output terminal (OUTPUT) of the output control circuit 12 outputs a high-level signal.

In the third stage when the first clock signal CLK has a high level and the second clock signal CLKB has a low level, the seventh transistor M7 and the eighth transistor M8 are turned on, and the input circuit 11 cannot transmit the data signal to the output control circuit 12. Since the signal output terminal of the output control circuit 12 outputs a high-level signal at the second stage, an initial potential of the signal output terminal of the output control circuit 12 in the third stage is at high level. With the high level, the eleventh transistor M11 and the thirteenth transistor M13 are turned on, and the twelfth transistor M12 and the fourteenth transistor M14 are turned off. Therefore, an NOR gate circuit composed of the eleventh transistor M11, the twelfth transistor M12, the thirteenth transistor M13, and the fourteenth transistor M14 outputs a low-level signal. In the case that the NOR gate circuit outputs a low-level signal, the ninth transistor M9 can be turned on and the tenth transistor M10 can be turned off. Therefore, the signal output terminal (OUTPUT) of the output control circuit 12 always outputs a high-level signal.

According to the above operation process, the signal output terminal of the output control circuit 12 outputs a low-level signal in the first stage, the signal output terminal of the output control circuit 12 outputs a high-level signal in the second stage, and the signal output terminal of the output control circuit 12 outputs a high-level signal in the third stage. Since an output signal from the signal output terminal of the output control circuit 12 may be input to a signal input terminal INPUT of a shift register 1 in the next row, the signal input to the signal input terminal INPUT of the shift register 1 in the next row from the first stage to the third stage has a low level, a high level and a high level, respectively. While the signal input to signal input terminal INPUT of the shift register 1 in the current row from the first stage to the third stage has a high level, a high level and a low level, respectively. As such, the input signal of the shift register 1 in the next row is delayed by a time period (i.e., half a clock cycle) with respect to the input signal of the shift register 1 in the current row. In addition, the output control circuit 12 has a simple structure and lower power consumption. The output control circuit 12 can realize the row-by-row transmission with delay of the data signal and the scanning of the signal.

In an embodiment, the first transistor M1, the second transistor M2, the fifth transistor M5, the seventh transistor M7, the ninth transistor M9, the eleventh transistor M11, and the twelfth transistor M12 are P-type transistors. The third transistor M3, the fourth transistor M4, the sixth transistor M6, the eighth transistor M8, the tenth transistor M10, the thirteenth transistor M13, and the fourteenth transistor M14 are N-type transistors. In the embodiment, when the control signal input to the gate has a high level, an N-type transistor is turned on, and a P-type transistor is turned off. When the control signal input to the gate has a low level, the N-type transistor is turned off, and the P-type transistor is turned on. It is to be noted that other types of transistors may be applied as the first to fourth transistors M1 to M14 as long as the control function of the shift register 1 as described above can be realized.

In an embodiment, the first clock signal CLK and the second clock signal CLKB are signals inverted with regard to each other. In this embodiment, the signals from the first clock signal terminal and the second clock signal terminal are signals inverted with regard to each other. For example, when the first clock signal has a high level, the second clock signal has a low level; when the first clock signal has a low level, the second clock signal has a high level. In this embodiment, in the first stage, the first clock signal has a high level, and the second clock signal has a low level. In the second stage, the first clock signal has a low level, and the second clock signal has a high level. In the third stage, the first clock signal has a high level, and the second clock signal has a low level. One cycle includes two stages. With the repeated transitions of the first clock signal and the second clock signal, the control of the output control circuit 12 can be realized.

Figure 3:
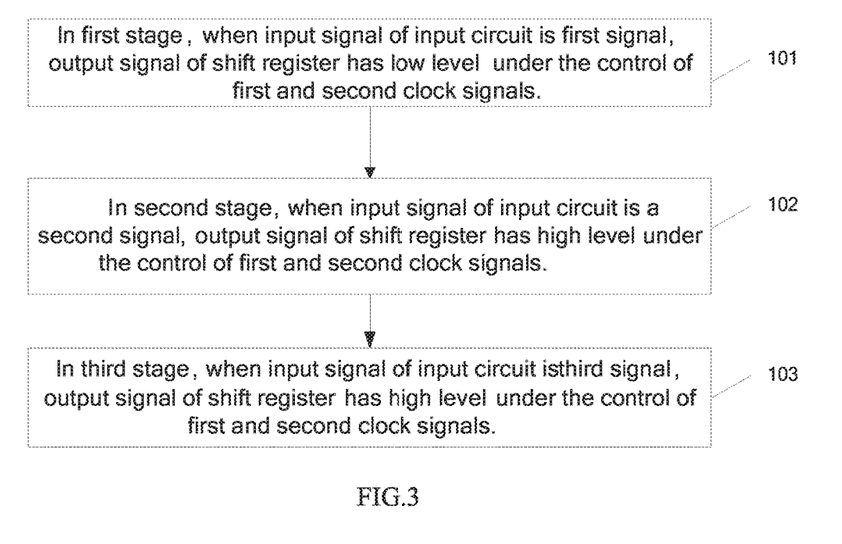
FIG. 3 is a flowchart of a driving method according to an embodiment of the present disclosure.

FIG. 3 is a flowchart of a driving method according to an embodiment of the present disclosure. As shown in FIG. 3, the driving method for driving the shift register 1 includes step 101, step 102 and step 103.

Step 101, in the first stage, when an input signal of the input circuit 11 is a first signal, an output signal of the shift register 1 is a third signal under the control of the first clock signal CLK and the second clock signal CLKB.

In the first stage, the first signal may have a high level, and the third signal may have a low level. Since the signal input terminal INPUT is supplied with a high-level signal, the first clock signal CLK has a high level, and the second clock signal CLKB has a low level, the fifth transistor M5 and the sixth transistor M6 are turned off, and thus the data signal cannot be transmitted from the input circuit 11 to the output control circuit 12. Further, the eleventh transistor M11 and the twelfth transistor M12 are turned on. Since the output signal from the output control circuit 12 has a low level as an initial level, the thirteenth transistor M13 and the fourteenth transistor M14 are turned off. Since the seventh transistor M7 and the eighth transistor M8 are turned on, the high-level signal from the first power terminal VDD can be transmitted to the gates of the ninth transistor M9 and the tenth transistor M10 through the eleventh transistor M11, the twelfth transistor M12, the seventh transistor M7 and the eighth transistor M8, so that the ninth transistor M9 is turned off and the tenth transistor M10 is turned on. Therefore, the low-level signal from the second power terminal VSS can be transmitted to the signal output terminal of the output control circuit 12 through the tenth transistor M10, and thus the shift register 1 can output a low-level signal. The level of the signal from the first power terminal VDD is higher (or greater) than the level of the signal from the second power terminal VSS.

Step 102, in the second stage, when the input signal of the input circuit 11 is the second signal, the output signal of the shift register 1 is the first signal under the control of the first clock signal CLK and the second clock signal CLKB.

In the second stage, the second signal may have a high level, and the first signal may have a high level. Since the signal input terminal INPUT is supplied with a high-level signal, the first clock signal CLK has a low level, and the second clock signal CLKB has a high level, the second transistor M2 is turned off, and the third transistor M3 is turned on. Since the fifth transistor M5 and the sixth transistor M6 are turned on, a low-level signal from the second power terminal VSS can be output to the gates of the ninth transistor M9 and the tenth transistor M10 through the third transistor M3, the fifth transistor M5, and the sixth transistor M6, so that the ninth transistor M9 is turned on. Therefore, the high-level signal from the first power terminal VDD can be transmitted to the signal output terminal of the output control circuit 12 through the ninth transistor M9, and thus the shift register 1 can output a high-level signal.

Step 103, in the third stage, when the input signal of the input circuit 11 is the third signal, the output signal of the shift register 1 is the second signal under the control of the first clock signal CLK and the second clock signal CLKB.

In the third stage, the third signal may have a low level, and the second signal may have a high level. Since the signal input terminal INPUT is supplied with a low-level signal, the first clock signal CLK has a high level, and the second clock signal CLKB has a low level, the fifth transistor M5 and the sixth transistor M6 are turned off, so that the data signal cannot be transmitted from the input circuit 11 to the output control circuit 12. Since the output signal of the output control circuit 12 has a high level in the second stage, the twelfth transistor M12 and the fourteenth transistor M14 are turned off, the eleventh transistor M11 and the thirteenth transistor M13 are turned on. Since the seventh transistor M7 and the eighth transistor M8 are turned on, the low-level signal from the second power terminal VSS can be transmitted to the gates of the ninth transistor M9 and the tenth transistor M10 through the thirteenth transistor M13, the seventh transistor M7, and the eighth transistor M8, so that the ninth transistor M9 is turned on, and the tenth transistor M10 is turned off. Therefore, the high-level signal from the first power terminal VDD can be transmitted to the signal output terminal of the output control circuit 12 through the ninth transistor M9, and thus the shift register 1 can output a high-level signal.

According to the above driving method, from the first stage to the third stage, the output signal from output control circuit 12 has a low level, a high level and a high level, respectively. Since the output signal from the output control circuit 12 in the current row may be input, as an input signal, to the input circuit 11 in the next row, the input signal of the input circuit 11 in the next row has a low level, a high level and a high level, respectively, from the first stage to the third stage. According to the above driving method, the input signal of the input circuit 11 in the current row has a high level, a high level and a low level, respectively. Therefore, the input signal of the shift register 1 in the next row may be delayed by a time period (i.e., half a clock cycle) with respect to the input signal of the shift register 1 in the current row, so that the transmission with delay of the signal can be realized, and multiple rows of driving circuits in the display device can perform sequential scanning to ensure the display effect.

As shown in FIGS. 2, 4, 5 and 6, an embodiment of the present disclosure further provides a gate driving circuit including a plurality of cascaded gate driving units, and each of the gate driving units includes the shift register 1 described above.

The gate driving circuit according to the present disclosure includes: a plurality of cascaded gate driving units, each of the gate driving units includes the above-mentioned shift register, and each shift register includes an input circuit and an output control circuit. The input circuit may transmit the data signal from an input terminal to the output control circuit, and then the output control circuit delays and outputs the data signal to the signal input terminal INPUT of the shift register in the next row so as to implement the control of a driving circuit in the next row and the scanning of the data signal. Furthermore, the output terminal of the shift register may further transmit the data signal to a gate of the pixel driving transistor, so as to control the driving circuit in the row in which the shift register is located. With the input circuit and the output control circuit, the structure of the driving circuit is simplified, the number of transistors is reduced, manufacturing cost of components is lower, and the power consumption of the driver circuit is reduced.

Figure 4:
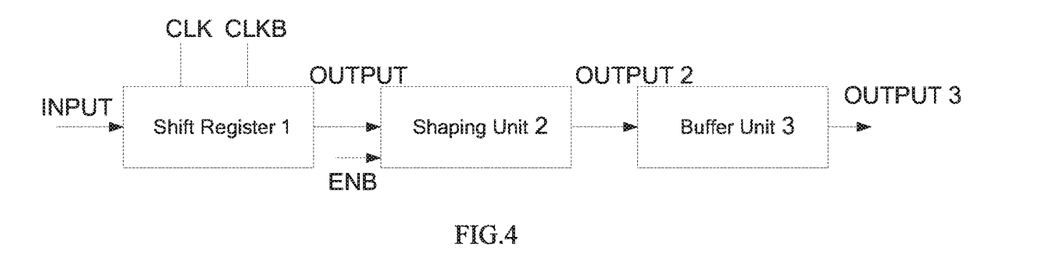
FIG. 4 is a block diagram of a gate driving circuit according to an embodiment of the present disclosure.

FIG. 4 is a block diagram of a gate driving circuit according to an embodiment of the present disclosure. As shown in FIG. 4, each gate driving unit further includes: a shaping unit 2 coupled to the signal output terminal (OUTPUT) of the shift register 1, an enable signal terminal, the first power terminal VDD, and the second power terminal VSS. The shaping unit 2 is configured to adjust a pulse width of the data signal output from the shift register 1 under the control of an enable signal ENB. In this embodiment, the data signal outputted from the output control circuit 12 is transmitted to the gate of the pixel driving transistor after going the shaping unit 2. The shaping unit 2 can adjust the pulse width of the data signal entering the shaping unit 2 so as to reduce the inter-influence between the data signals from a plurality of gate driving units, thereby improving the control effect.

Figure 5:
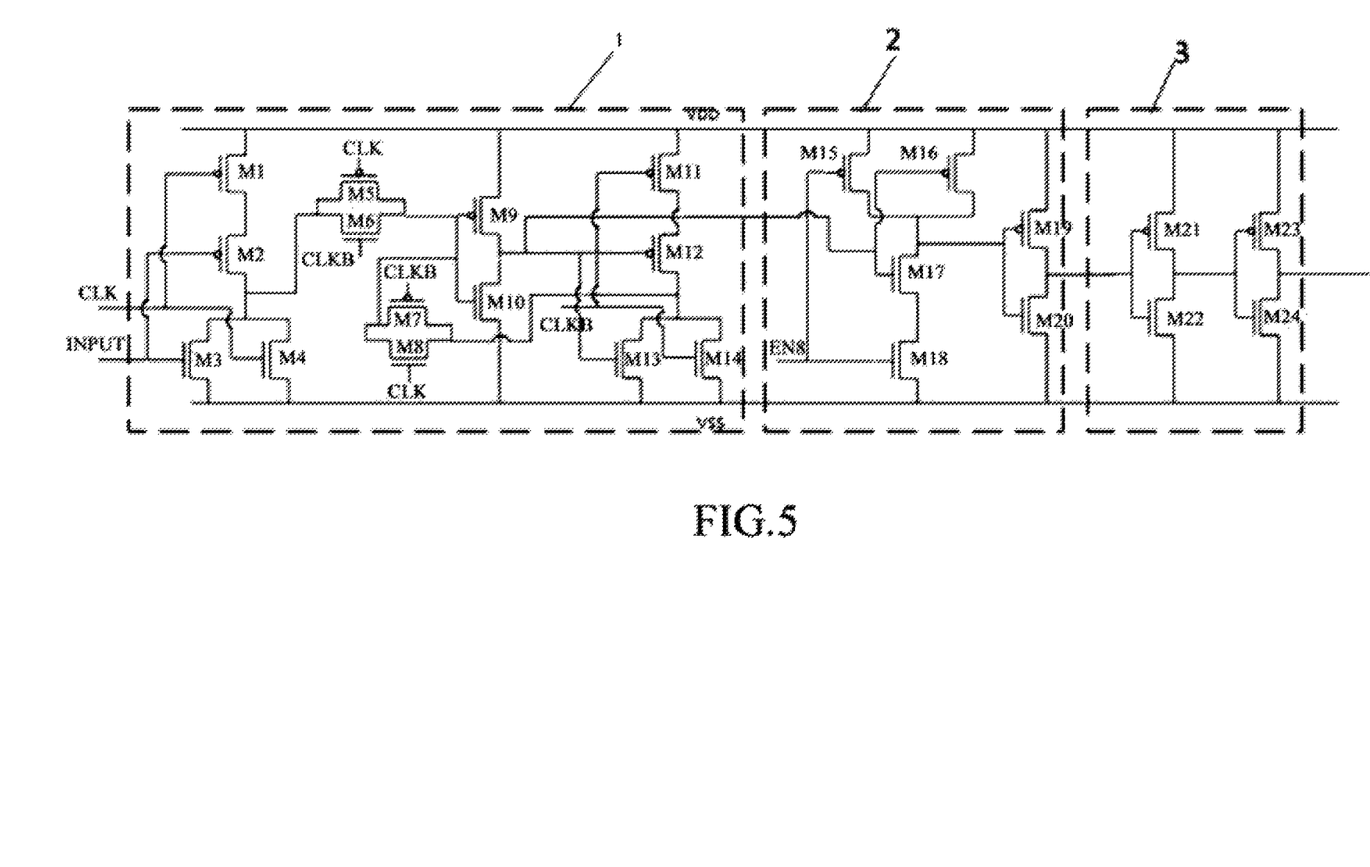
FIG. 5 is a schematic structural diagram of a gate driving unit according to an embodiment of the present disclosure.

The structure of the shaping unit 2 may be designed in various forms. In an embodiment, the shaping unit 2 includes a fifteenth transistor M15, a sixteenth transistor M16, a seventeenth transistor M17, an eighteenth transistor M18, a nineteenth transistor M19, and a twentieth transistor M20. The fifteenth transistor M15 has a first electrode, a second electrode and a gate, the first electrode of the fifteenth transistor M15 is coupled to the first power terminal VDD, the second electrode of the fifteenth transistor M15 is coupled to a gate of the nineteenth transistor M19 and a gate of the twentieth transistor M20, and the gate of the fifteenth transistor M15 is coupled to the enable signal terminal. The sixteenth transistor M16 has a first electrode, a second electrode and a gate, the first electrode of the sixteenth transistor M16 is coupled to the first power terminal VDD, the second electrode of the sixteenth transistor M16 is coupled to the gate of the nineteenth transistor M19 and the gate of the twentieth transistor M20, and the gate of the sixteenth transistor M16 is coupled to an output terminal of the shift register 1. The eighteenth transistor M18 has a first electrode, a second electrode and a gate, the first electrode of the eighteenth transistor M18 is coupled to the second power terminal VSS, the second electrode of the eighteenth transistor M18 is coupled to a first electrode of a seventeenth transistor M17, and the gate of the eighteenth transistor M18 is coupled to the enable signal terminal. The seventeenth transistor M17 has a second electrode and a gate, the second electrode of the seventeenth transistor M17 is coupled to the gate of the nineteenth transistor M19 and the gate of the twentieth transistor M20, and the gate of the seventeenth transistor M17 is coupled to the output terminal of the shift register 1. The nineteenth transistor M19 has a first electrode and a second electrode, the first electrode of the nineteenth transistor M19 is coupled to the first power terminal VDD, and the second electrode of the nineteenth transistor M19 is coupled to an output terminal of the shaping unit 2. The twentieth transistor M20 has a first electrode and a second electrode, the first electrode of the twentieth transistor M20 is coupled to the second power terminal VSS, and the second electrode of the twentieth transistor M20 is coupled to the output terminal of the shaping unit 2.

In this embodiment, in the first stage when the output signal terminal (OUTPUT) of the output control circuit 12 is at a low level and the enable signal ENB has a low level, the fifteenth transistor M15 and the sixteenth transistor M16 are turned on, the seventeenth transistor M17 and the eighteenth transistor M18 are turned off, the nineteenth transistor M19 is turned off, and the twentieth transistor M20 is turned on, and thus the shaping unit 2 outputs a low-level signal (OUTPUT2).

In the second stage when the output signal of the output control circuit 12 has a high level and the enable signal ENB has a high level, the fifteenth transistor M15 and the sixteenth transistor M16 are turned off, and the seventeenth transistor M17 and the eighteenth transistor M18 are turned on, the nineteenth transistor M19 is turned on, and the twentieth transistor M20 is turned off, and thus the shaping unit 2 outputs a high-level signal (OUTPUT2).

In the third stage when the output signal of the output control circuit 12 has a high level and the enable signal ENB has a low level, the fifteenth transistor M15 is turned on, the sixteenth transistor M16 is turned off, the seventeenth transistor M17 is turned on, the eighteenth transistor M18 is turned off, the nineteenth transistor M19 is turned off, and the twentieth transistor M20 is turned on, and thus the shaping unit 2 outputs a low-level signal (OUTPUT2).

According to the above operation process, the adjustment of pulse width of the data signal can be realized. In addition, the shaping unit 2 has a simple structure and lower power consumption.

As shown in FIG. 4, each gate driving unit further includes a buffer unit 3 coupled to an output terminal of the shaping unit 2. The buffer unit 3 is configured to smooth the data signal from the shaping unit 2. In this embodiment, the buffer unit 3 can smooth the data signal from the shaping unit 2 by removing the glitches in the data signal's waveform, so that the quality of the data signal can be improved.

The structure of the buffer unit 3 may be designed in various forms. In an embodiment, the buffer unit 3 includes a twenty-first transistor M21, a twenty-second transistor M22, a twenty-third transistor M23, and a twenty-fourth transistor M24. The twenty-first transistor M21 has a first electrode, a second electrode and a gate, the first electrode of the twenty-first transistor M21 is coupled to the first power terminal VDD, the second electrode of the twenty-first transistor M21 is coupled to a gate of the twenty-third transistor M23 and a gate of the twenty-fourth transistor M24, and the gate of the twenty-first transistor M21 is coupled to the output terminal of the shaping unit 2. The twenty-second transistor M22 has a first electrode, a second electrode and a gate, the first electrode of the twenty-second transistor M22 is coupled to the second power terminal VSS, the second electrode the twenty-second transistor M22 is coupled to the gate of the twenty-third transistor M23 and the gate of the twenty-fourth transistor M24, and the gate the twenty-second transistor M22 is coupled to the output terminal of the shaping unit 2. The twenty-third transistor M23 has a first electrode and a second electrode, the first electrode of the twenty-third transistor M23 is coupled to the first power terminal VDD, and the second electrode of the twenty-third transistor M23 is coupled to an output terminal of the buffer unit 3. The twenty-fourth transistor M24 has a first electrode and a second electrode, the first electrode of the twenty-fourth transistor M24 is coupled to the second power terminal VSS, and the second electrode of the twenty-fourth transistor M24 is coupled to the output terminal of the buffer unit 3.

In this embodiment, in the first stage when the input signal of the buffer unit 3 has a low level, the twenty-first transistor M21 is turned on, the twenty-second transistor M22 is turned off, the twenty-third transistor M23 is turned off, and the twenty-fourth transistor M24 is turned on, so that a low-level signal (OUTPUT3) is output from the buffer unit 3 and transmitted to the gate of the pixel driving transistor.

In the second stage when the input signal of the buffer unit 3 has a high level, the twenty-first transistor M21 is turned off, the twenty-second transistor M22 is turned on, the twenty-third transistor M23 is turned on, and the twenty-fourth transistor M24 is turned off, so that a high-level signal (OUTPUT3) is output from the buffer unit 3 and transmitted to the gate of the pixel driving transistor.

In the third stage when the input signal of the buffer unit 3 has a low level, the twenty-first transistor M21 is turned on, the twenty-second transistor M22 is turned off, the twenty-third transistor M23 is turned off, and the twenty-fourth transistor M24 is turned on, so that a low-level signal (OUTPUT3) is output from the buffer unit 3 and transmitted to the gate of the pixel driving transistor.

With the above logic control, the data signal can be smoothed, and glitches at the edge of the data signal's waveform can be removed, thereby improving the quality of the data signal.

The fifteenth transistor M15, the sixteenth transistor M16, the nineteenth transistor M19, the twenty-first transistor M21, and the twenty-third transistor M23 are P-type transistors. The seventeenth transistor M17, the eighteenth transistor M18, the twentieth transistor M20, the twenty-second transistor M22, and the twenty-fourth transistor M24 are N-type transistors. In this embodiment, when a control signal input to the gate has a high level, an N-type transistor is turned on and a P-type transistor is turned off. When a control signal input to the gate has a low level, an N-type transistor is turned off and a P-type transistor is turned on. It should be noted that other type of transistors can be applied as the fifteenth transistor M15 to the twenty-fourth transistor M24 as long as the control functions of the shaping unit 2 and the buffer unit 3 as described above can be realized.

Figure 6:
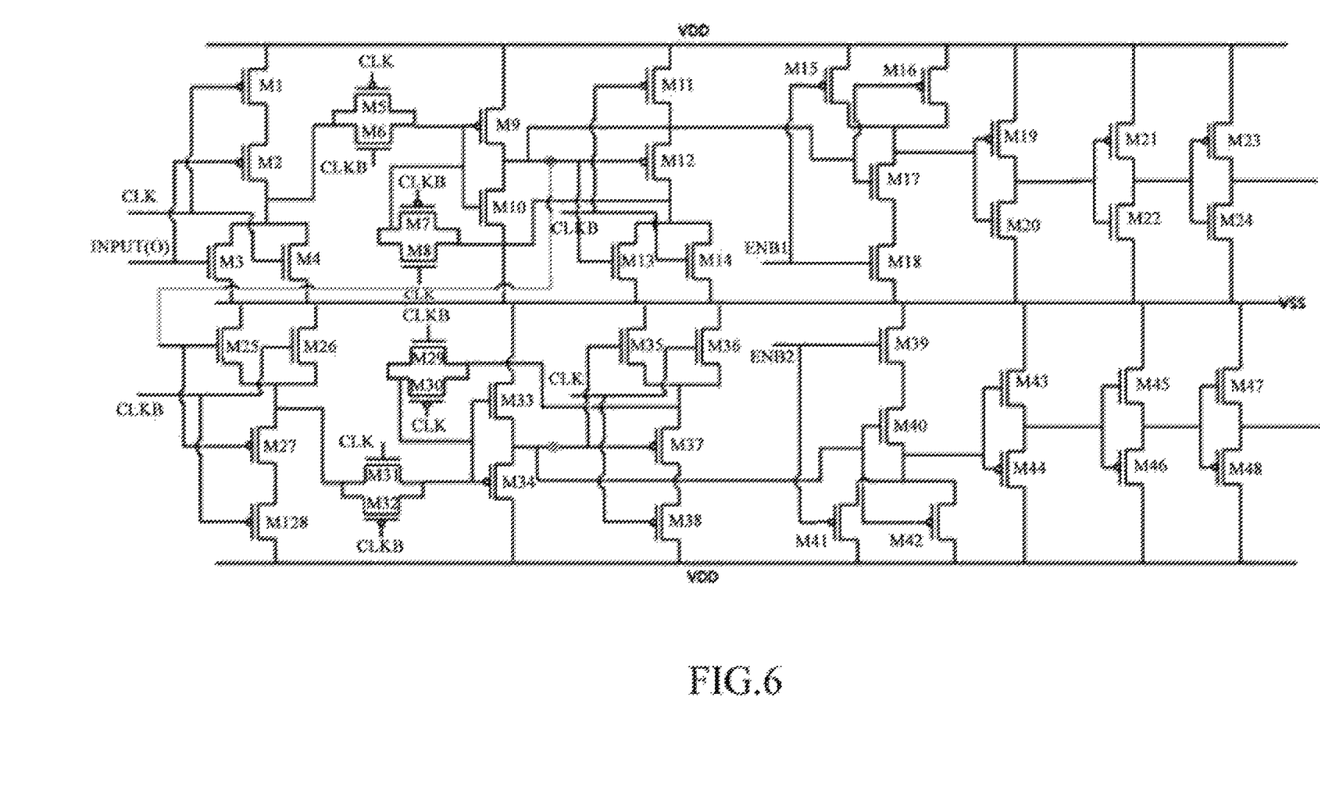
FIG. 6 is a schematic structural diagram of a gate driving circuit according to an embodiment of the present disclosure.

FIG. 6 is a schematic structural diagram of a gate driving circuit according to an embodiment of the present disclosure. As shown in FIG. 6, any two adjacent gate driving units include an upper-stage gate driving unit and a lower-stage gate driving unit. An output terminal of a shift register in the upper-stage gate driving unit is coupled to a signal input terminal INPUT of a shift register in the lower-stage gate driving unit. In the embodiment, the output terminal of the shift register in the upper-stage gate driving unit is coupled to the signal input terminal INPUT of the shift register in the lower-stage gate driving unit. With the shift register, the transmission with delay of the data signal can be realized, and multiple stages of gate driving circuit units can perform stage-by-stage scanning.

According to the embodiments, the gate driving circuit according to the disclosure may include the shift register, the shaping unit and the buffer unit. The driving method for the gate driving circuit may include a first stage, a second stage and a third stage.

In the first stage when the signal input terminal INPUT is supplied with a high-level signal, the data signal (i.e., the high-level signal) input from the signal input terminal INPUT is shaped, buffered and output as a low-level signal via the signal output terminal (OUTPUT 3) under the control of the first clock signal CLK, the second clock signal CLKB and the enable control signal ENB.

In the second stage when the signal input terminal INPUT is supplied with a high-level signal, the data signal (i.e., the high-level signal) input from signal input terminal INPUT is shaped, buffered and output as a high-level signal via the signal output terminal (OUTPUT 3) under the control of the first clock signal CLK, the second clock signal CLKB and the enable control signal ENB.

In the third stage when the signal input terminal INPUT is supplied with a low-level signal, the data signal (i.e., the low-level signal) input from the signal input terminal INPUT is shaped, buffered and output as a low-level signal via the signal output terminal (OUTPUT3) under the control of the first clock signal CLK, the second clock signal CLKB and the enable control signal ENB.

The control logic of the above three stages is described in detail in the above embodiments, and the details thereof are omitted herein.

In an embodiment, a display device including the gate driving circuit is provided.

The display device according to the present disclosure includes: a plurality of cascaded gate driving units, each of the gate driving units including the above-described shift register. Each shift register includes an input circuit and an output control circuit. The input circuit may transmit the data signal from the input terminal to the output control circuit, and then the output control circuit may delay and output the data signal to a signal input terminal of the shift register in the next row, so as to implement the control of a driving circuit in the next row and the scanning of the data signal. Furthermore, the shift register can further transmit the data signal to the gate of the pixel driving transistor, so as to control the driving circuit in the row in which the shift register is located. With the input circuit and the output control circuit, the structure of the driving circuit is simplified, the number of transistors is reduced, manufacturing cost of components is lower, and the power consumption is reduced.

It should be understood that the above implementations are merely exemplary implementations adopted for the purpose of illustrating the principles of the present disclosure, but the present disclosure is not limited thereto. It will be apparent to those skilled in the art that various changes and improvements can be made without departing from the spirit and essence of the present disclosure, and these changes and improvements are also to be regarded as falling into the scope of the present disclosure.

What is claimed is:

1. A shift register comprising:
   an input circuit, respectively coupled to a signal input terminal, a first clock signal terminal, a second clock signal terminal, a first power terminal and a second power terminal, and the input circuit being configured to transmit a first signal from the first power terminal or a second signal from the second power terminal to an output control circuit under control of an input signal, a first clock signal and a second clock signal; and
   the output control circuit, respectively coupled to the input circuit, the first clock signal terminal, the second clock signal terminal, the first power terminal, the second power terminal, and a signal output terminal, the output control circuit being configured to transmit the first signal from the first power terminal or the second signal from the second power terminal to the signal output terminal under control of the first clock signal and the second clock signal,
   wherein the input signal input to the shift register is delayed and output to a signal input terminal of a shift register in a next row.

2. The shift register according to claim 1, wherein
   the input circuit comprises: a first transistor, a second transistor, a third transistor, a fourth transistor, a fifth transistor, and a sixth transistor;
   the first transistor has a first electrode, a second electrode and a gate, the first electrode of the first transistor is coupled to the first power terminal, the second electrode of the first transistor is coupled to a first electrode of the second transistor, and the gate of the first transistor is coupled to the first clock signal terminal;
   the second transistor has a second electrode and a gate, the second electrode of the second transistor is coupled to a first electrode of the fifth transistor and a first electrode of the sixth transistor, and the gate of the second transistor is coupled to the signal input terminal;
   the third transistor has a first electrode, a second electrode and a gate, the first electrode of the third transistor is coupled to the second power terminal, the second electrode of the third transistor is coupled to the first electrode of the fifth transistor and the first electrode of the sixth transistor, and the gate of the third transistor is coupled to the signal input terminal;
   the fourth transistor has a first electrode, a second electrode and a gate, the first electrode of the fourth transistor is coupled to the second power terminal, the second electrode of the fourth transistor is coupled to the first electrode of the fifth transistor and the first electrode of the sixth transistor, and the gate of the fourth transistor is coupled to the first clock signal terminal;
   the fifth transistor has a second electrode and a gate, the second electrode of the fifth transistor is coupled to an output terminal of the input circuit, and the gate of the fifth transistor is coupled to the first clock signal terminal; and
   the sixth transistor has a second electrode and a gate, the second electrode of the sixth transistor is coupled to the output terminal of the input circuit, and the gate of the sixth transistor is coupled to the second clock signal terminal.

3. The shift register according to claim 2, wherein
   the output control circuit comprises a seventh transistor, an eighth transistor, a ninth transistor, a tenth transistor, an eleventh transistor, a twelfth transistor, a thirteenth transistor, and a fourteenth transistor;
   the ninth transistor has a first electrode, a second electrode and a gate, the first electrode of the ninth transistor is coupled to the first power terminal, the second electrode of the ninth transistor is coupled to the signal output terminal of the output control circuit, and the gate of the ninth transistor is coupled to the output terminal of the input circuit;

the tenth transistor has a first electrode, a second electrode and a gate, the first electrode of the tenth transistor is coupled to the second power terminal, the second electrode of the tenth transistor is coupled to the signal output terminal of the output control circuit, and the gate of the tenth transistor is coupled to the output terminal of the input circuit;

the eleventh transistor has a first electrode, a second electrode and a gate, the first electrode of the eleventh transistor is coupled to the first power terminal, the second electrode of the eleventh transistor is coupled to a first electrode of the twelfth transistor, and the gate of the eleventh transistor is coupled to the second clock signal terminal;

the twelfth transistor has a second electrode and a gate, the second electrode of the twelfth transistor is coupled to a first electrode of the seventh transistor and a first electrode of the eighth transistor, and the gate of the twelfth transistor is coupled to the signal output terminal of the output control circuit;

the thirteenth transistor has a first electrode, a second electrode and a gate, the first electrode of the thirteenth transistor is coupled to the second power terminal, the second electrode of the thirteenth transistor is coupled to the first electrode of the seventh transistor and the first electrode of the eighth transistor, and the gate of the thirteenth transistor is coupled to the signal output terminal of the output control circuit;

the fourteenth transistor has a first electrode, a second electrode and a gate, the first electrode of the fourteenth transistor is coupled to the second power terminal, the second electrode of the fourteenth transistor is coupled to the first electrode of the seventh transistor and the first electrode of the eighth transistor, and the gate of the fourteenth transistor is coupled to the second clock signal terminal;

the seventh transistor has a second electrode and a gate, the second electrode of the seventh transistor is coupled to the gate of the ninth transistor and the gate of the tenth transistor, and the gate of the seventh transistor is coupled to the second clock signal terminal; and the eighth transistor has a second electrode and a gate, the second electrode of the eighth transistor is coupled to the gate of the ninth transistor and the gate of the tenth transistor, and the gate of the eighth transistor is coupled to the first clock signal terminal.

4. The shift register according to claim 3, wherein
the first transistor, the second transistor, the fifth transistor, the seventh transistor, the ninth transistor, the eleventh transistor, and the twelfth transistor are P-type transistors; and
the third transistor, the fourth transistor, the sixth transistor, the eighth transistor, the tenth transistor, the thirteenth transistor, and the fourteenth transistor are N-type transistors.

5. The shift register according to claim 1, wherein
the first clock signal and the second clock signal are inverted with respect to each other.

6. The shift register according to claim 1, wherein
the first power terminal is configured to output a first level, and the second power terminal is configured to output a second level, the first level being higher than the second level.

7. A driving method for driving a shift register, the shift register being the shift register according to claim 1, the driving method comprising:
controlling the shift register to output a third signal as an output signal under control of the first clock signal and the second clock signal, at a first stage when the input signal of the input circuit is a first signal;
controlling the shift register to output the first signal as the output signal under control of the first clock signal and the second clock signal, at a second stage when the input signal of the input circuit is a second signal; and
controlling the shift register to output the second signal as the output signal under control of the first clock signal and the second clock signal, at a third stage when the input signal of the input circuit is the third signal.

8. A gate driving circuit comprising: a plurality of cascaded gate driving units, each of the gate driving units comprising the shift register of claim 1.

9. The gate driving circuit according to claim 8, wherein
each of the gate driving units further comprises a shaping unit coupled to the signal output terminal of the shift register, an enable signal terminal, the first power terminal, and the second power terminal, and
the shaping unit is configured to adjust a pulse width of a data signal output from the shift register under control of an enable signal.

10. The gate driving circuit according to claim 9, wherein
the shaping unit comprises: a fifteenth transistor, a sixteenth transistor, a seventeenth transistor, an eighteenth transistor, a nineteenth transistor, and a twentieth transistor;
the fifteenth transistor has a first electrode, a second electrode and a gate, the first electrode of the fifteenth transistor is coupled to the first power terminal, the second electrode of the fifteenth transistor is coupled to a gate of the nineteenth transistor and a gate of the twentieth transistor, and the gate of the fifteenth transistor is coupled to the enable signal terminal;
the sixteenth transistor has a first electrode, a second electrode and a gate, the first electrode of the sixteenth transistor is coupled to the first power terminal, the second electrode of the sixteenth transistor is coupled to the gate of the nineteenth transistor and the gate of the twentieth transistor, and the gate of the sixteenth transistor is coupled to the signal output terminal of the shift register;
the seventeenth transistor has a first electrode, a second electrode and a gate, the first electrode of the seventeenth transistor is coupled to a second electrode of the eighteenth transistor, the second electrode of the seventeenth transistor is coupled to the gate of the nineteenth transistor and the gate of the twentieth transistor, and the gate of the seventeenth transistor is coupled to the signal output terminal of the shift register;
the eighteenth transistor has a first electrode, a second electrode and a gate, the first electrode of the eighteenth transistor is coupled to the second power terminal, the second electrode of the eighteenth transistor is coupled to the first electrode of the seventeenth transistor, and the gate of the eighteenth transistor is coupled to the enable signal terminal;
the nineteenth transistor has a first electrode and a second electrode, the first electrode of the nineteenth transistor is coupled to the first power terminal, and the second electrode of the nineteenth transistor is coupled to an output terminal of the shaping unit; and the twentieth transistor has a first electrode and a second electrode, the first electrode of the twentieth transistor is coupled to the second power terminal, and the second electrode of the twentieth transistor is coupled to the output terminal of the shaping unit.

11. The gate driving circuit according to claim 10, wherein each of the gate driving units further comprises a buffer unit coupled to the output terminal of the shaping unit, and the buffer unit is configured to smooth a data signal from the shaping unit.

12. The gate driving circuit according to claim 11, wherein the buffer unit comprises: a twenty-first transistor, a twenty-second transistor, a twenty-third transistor, and a twenty-fourth transistor;

the twenty-first transistor has a first electrode, a second electrode and a gate, the first electrode of the twenty-first transistor is coupled to the first power terminal, the second electrode of the twenty-first transistor is coupled to a gate of the twenty-third transistor and a gate of the twenty-fourth transistor, and the gate of the twenty-first transistor is coupled to the output terminal of the shaping unit;

the twenty-second transistor has a first electrode, a second electrode and a gate, the first electrode of the twenty-second transistor is coupled to the second power terminal, the second electrode of the twenty-second transistor is coupled to the gate of the twenty-third transistor and the gate of the twenty-fourth transistor, and the gate of the twenty-second transistor is coupled to the output terminal of the shaping unit;

the twenty-third transistor has a first electrode and a second electrode, the first electrode of the twenty-third transistor is coupled to the first power terminal, and the second electrode of the twenty-third transistor is coupled to an output terminal of the buffer unit; and the twenty-fourth transistor has a first electrode and a second electrode, the first electrode of the twenty-fourth transistor is coupled to the second power terminal, and the second electrode of the twenty-fourth transistor is coupled to the output terminal of the buffer unit.

13. The gate driving circuit according to claim 12, wherein the fifteenth transistor, the sixteenth transistor, the nineteenth transistor, the twenty-first transistor, and the twenty-third transistor are P-type transistors; and the seventeenth transistor, the eighteenth transistor, the twentieth transistor, the twenty-second transistor, and the twenty-fourth transistor are N-type transistors.

14. The gate driving circuit according to claim 13, wherein any two adjacent gate driving units comprise an upper-stage gate driving unit and a lower-stage gate driving unit, and an output terminal of a shift register in the upper-stage gate driving unit is coupled to a signal input terminal of a shift register in the lower-stage gate driving unit.

15. A display device, comprising the gate driving circuit according to claim 8.

* * * * *